Nov. 22, 1966 J. C. McALVAY 3,287,176

THERMOELECTRIC APPARATUS

Filed Oct. 15, 1962 2 Sheets-Sheet 1

INVENTOR
JOHN C. McALVAY by
Mason, Kolehmainen, Rathburn and Wyss
ATTORNEYS.

Nov. 22, 1966 J. C. McALVAY 3,287,176

THERMOELECTRIC APPARATUS

Filed Oct. 15, 1962 2 Sheets-Sheet 2

INVENTOR.
JOHN C. McALVAY
BY Mason, Kolehmainen Rathburn and Wyss
ATTORNEYS

United States Patent Office 3,287,176

Patented Nov. 22, 1966

3,287,176

THERMOELECTRIC APPARATUS

John C. McAlvay, Racine, Wis., assignor to Webster Electric Company, Racine, Wis., a corporation of Delaware Filed Oct. 15, 1962, Ser. No. 230,354
14 Claims. (Cl. 136—204)

The present invention relates to thermoelectric apparatus, such as heat pumps, and to thermoelectric devices for use in such pumps of the type used in heating and cooling devices, and more particularly to an improved structural arrangement for the thermoelectric devices and their associated thermoelectric conductors.

When two materials of two dissimilar thermoelectric properties are joined and a direct current is passed therethrough, the junction becomes either hot or cold depending upon the direction of the electrical current flowing through the junction. This phenomenon is known as the Peltier effect and exists in all junctions of dissimilar materials to some extent. Some materials and alloys, due to a combination of thermal and electrical properties, produce an effect that is many times the magnitude of others and these materials or alloys are called thermoelectric materials. Thermojunctions, for example, formed between certain alloys of lead, bismuth, antimony combined in various quantities with tellurium or selenium and having slight amounts of impurities, such as silver, gold or sulfur have exhibited heating and cooling properties of a magnitude that can be usefully applied to the fields of air-conditioning and refrigeration. One particular alloy which has proven satisfactory is bismuth-telluride. Moreover, the thermoelectric phenomenon is reversible so that is the junctions of such dissimilar materials are respectively heated and cooled, an electric current is generated and the thermoelectric apparatus becomes a thermoelectric generator.

A thermoelectric heating or cooling device in its simplest form comprises a source of direct current power which forces a current through a series of junctions of dissimilar thermoelectric materials. The thermojunctions either absorb heat or generate heat and are, therefore, segregated so that all like junctions are arranged in the same ambient. The cold junctions produce a cooling effect in one ambient, while the hot junctions dissipate heat to another ambient. Thermojunctions are frequently formed by securing two blocks or rods of dissimilar thermoelectric material through a conducting link. The conductor link not only conducts the electrical current to the respective thermoelectric members but also acts, at least in part, as a heat exchange surface to aid the transfer of heat to and from the thermojunction. It is desirable, therefore, to design a thermojunction so that heat may be conducted toward or away from the respective junction as rapidly as possible.

Generally speaking, a thermoelectric heating or cooling device comprises an array of thermojunctions connected in series and having elements having dissimilar thermoelectric properties. The thermoelectric elements are designated either N or P. The N and P nomenclature is prevalent in the semiconductor terminology at present and is used herein for convenience in differentiating materials having dissimilar thermoelectric properties. A thermoelectric material may be made of the N or P type by altering the impurities which are introduced therein.

There has been found, according to the present invention, that a thermoelectric device performs very efficiently when subjected to a compressive load. Heretofore, springs have been utilized and elaborate structures employed to maintain thermoelectric elements in compression. Such prior device have been complicated and have increased substantially the manufacturing expense, adding appreciably to the overall price of the thermoelectric device.

Due to the very fragile nature of semiconductive thermocouple legs under transverse and bending loads, a structural difficulty has existed in known devices, particularly where the thermocouple legs are so arranged, mounted, and connected that they are subject to transverse and/or tensile forces. These forces may be due to thermal expansion and contraction, to thermal creep of the associated structure, or mere mechanical inaccuracies of the parts.

Accordingly, it is an object of the present invention to provide a new and improved thermoelectric apparatus.

A further object of the present invention is to provide an improved heat pump of the type employing the thermoelectric principle of heating and cooling.

A further object of the present invention is to provide an improved thermoelectric device of the type suitable for use in a thermoelectric apparatus.

Yet a further object of the present invention is to provide a new and improved thermoelectric device wherein the thermoelectric element thereof is maintained in compression.

A further object of this invention is to provide a thermoelectric device having improved structural properties.

Yet a further object of the present invention is to provide a new and improved thermoelectric device which may be inexpensively and economically manufactured and assembled.

Further objects and advantages of the present invention will become apparent as the following description proceeds and the features of novelty which characterize the invention will be pointed out with particularly in the claims annexed to and forming a part of this specification.

Due to the very fragile nature of semiconductive thermocouple legs under transverse and bending loads, a structural difficulty has existed in known devices, particularly where the thermocouple legs are so arranged, mounted, and connected that they are subject to transverse and/or tensile forces. These forces may be due to thermal expansion and contraction, to thermal creep of the associated structure, or mere mechanical inaccuracies of the parts.

Accordingly, it is an object of the present invention to provide an improved heat pump of the type employing the thermoelectric principle of heating and cooling.

A further object of the present invention is to provide an improved thermoelectric device of the type suitable for use in a heat pump.

Yet a further object of the present invention is to provide a new and improved thermoelectric device wherein the thermoelectric element thereof is maintained in compression.

A further object of this invention is to provide a thermoelectric device having improved structural properties.

Yet a further object of the present invention is to provide a new and improved thermoelectric device which may be inexpensively and economically manufactured and assembled.

Yet another object of the present invention is to provide a new and improved thermoelectric device wherein the effects of thermal expansion and contraction of the thermoelectric element is minimized.

Further objects and advantages of the present invention will become apparent as the following description proceeds and the features of novelty which characterize the invention will be pointed out with particularity in the claims annexed to and forming a part of this specification.

In accordance with these and other objects there is provided a thermoelectric device such as a heat pump of the type utilizing the Peltier effect and including a plurality of thermoelectric devices. The thermoelectric elements are made in tubular form and are placed in radial compression between a pinlike and a cuplike connector. To this end, each of the thermoelectric devices is formed with a first cuplike element holder provided with an internal bore, tubular or sleeve-shaped thermoelectric element tightly positioned within the bore, and a second pinlike element holder provided with an external extension tightly positioned within the element. The holders are dimensioned and assembled so as to subject the thermoelectric element to radial compression. In a preferred embodiment of the invention the bore, thermoelectric element, and extension are all slightly tapered in generally frusto-conical shape so that the compressive load is applied by forcing or wedging the members of the thermoelectric device axially together. The thermoelectric element is subjected to sufficient compression to protect it against thermal creep of the parts during the life of the device.

Additionally, the heat pump includes support means of electrically insulating material carrying a plurality of thermoelectric devices with adjacent ones arranged reversed in direction. Each of the electrode holders is provided with a terminal portion and the terminal portion of adjacent holders are serially interconnected to provide a series circuit of the thermoelectric elements. Moreover, the element holders extending in one direction form one temperature junction and the terminals of the electrode holders extending in the opposite direction form a second temperature junction. The similar temperature junctions are respectively aligned in hot and cold ambients in order to heat the hot ambient or to draw out heat from the cold ambient area.

In one embodiment of the invention, adjacent thermoelectric elements are serially interconnected by busses arranged in zig-zag manner with each other so that thermal expansion and contraction in the busses results in a pivotlike movement of the thermoelectrical holders to minimize the stress on the thermoelectric elements.

According to yet another embodiment of the invention, there are provided tubular insulating members mounted at each side of each thermoelectric element surrounding the external extension of the pinlike element and positioned within the internal bore of the cuplike element thus taking the mechanical load off the fragile thermoelectric element.

For a better understanding of the present invention, reference may be had to the accompanying drawing, wherein.

Although the present invention is described in connection with a heat pump, it is understood that the invention is equally applicable to a thermoelectric generator.

Figure 1:
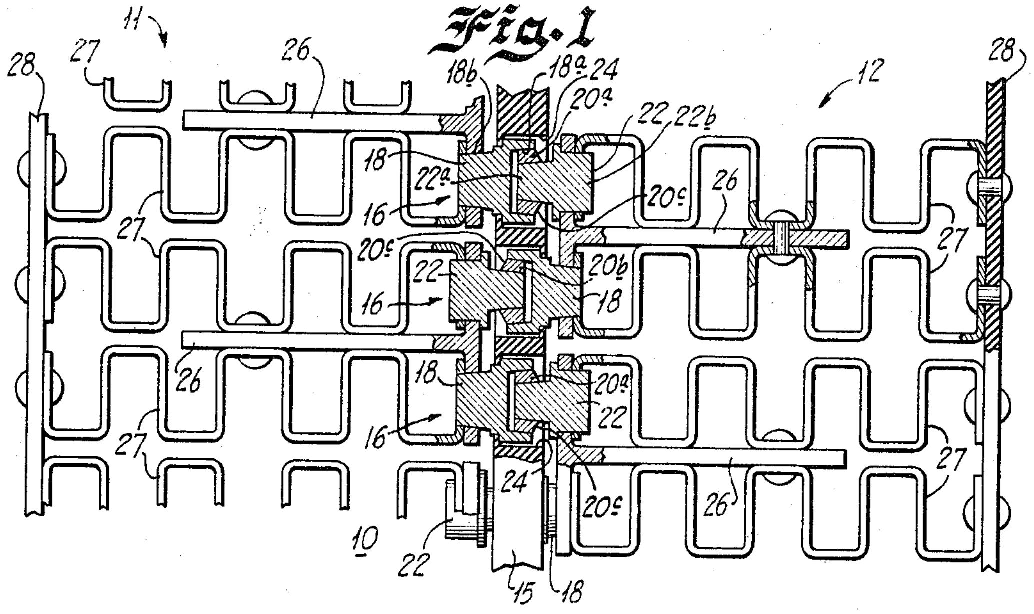
FIG. 1 is a cross-sectional view of a heat pump according to the present invention.
Figures 2, 3:
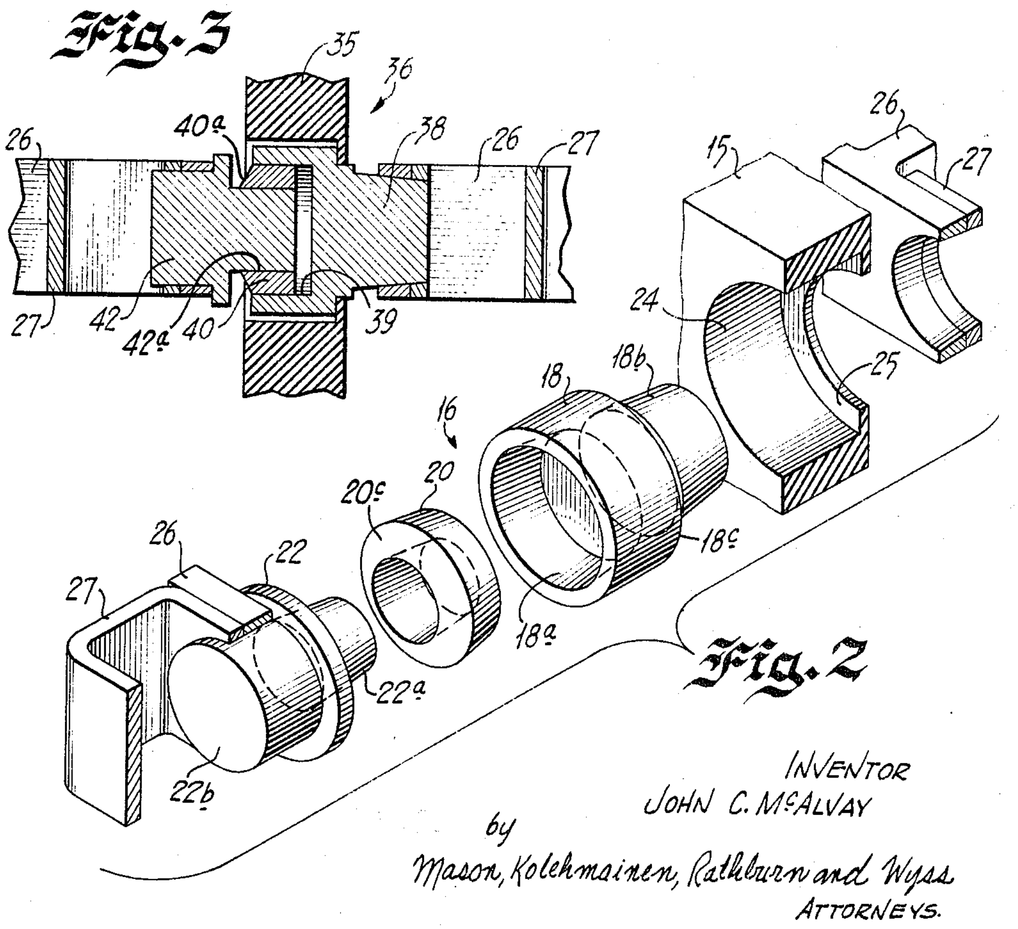
FIG. 2 is an exploded view of a thermoelectric device employed in the heat pump of FIG. 1.
FIG. 3 is a cross-sectional view of a thermoelectric device according to yet another embodiment of the present invention.

Referring now to the embodiment of FIGS. 1 and 2, there is fragmentarily illustrated a section of a heat pump according to the present invention and generally identified as 10 in FIG. 1. The heat pump is of the type utilizing the Peltier effect to maintain a hot and cold ambient in respective hot and cold areas generally identified as 11 and 12, respectively. A support plate 15 of electrically insulated material separates the hot and cold areas. In order to provide for the transfer of heat between the hot and cold areas 11 and 12, the support plate 15 carries a plurality of thermoelectric devices 16. Each of the thermoelectric devices includes a first cuplike element holder 18, best seen in FIG. 2, provided with an internal frusto-conical bore 18*a* extending partially therethrough. As illustrated in the embodiments of FIGS. 1 and 2, the frusto-conical bore 18*a* is provided with slightly tapered side walls, illustrated somewhat exaggerated, but which, in a particular embodiment, may have an actual taper of between ¼ inch and 1 inch per foot of length. Additionally, the thermoelectric devices 16 each include a thermoelectric element 20 illustrated as of generally frusto-conical sleeve shape and tightly positioned within the internal bore of the element holder 18. A second pinlike element holder 22 is provided with an external frusto-conical extension 22*a* tightly positioned within the thermoelectric element 20. The element holders 18 and 22 are dimensioned and assembled with a thermoelectric element in spaced relation from each other so as to provide generally radial compression in the thermoelectric element 20. The desired compression in the thermoelectric element 20 is readily obtained by axially wedging the holders 18 and 22 toward each other. As the thermoelectric device 16 forms a part of an electric circuit, the element holders 18 and 22 are formed of electrically conductive material such as copper and are each provided with respective terminal portions 18*b* and 22*b* for connection to an electric circuit. Moreover, in order to provide a ductile surface for embedment for the thermoelectric element 20 and, additionally, to assure a low resistance electrical contact with the thermoelectric element 20, the internal bore 18*a* and the external extension 22*a* of the element holders 18 and 22 may, if desired, have their side surfaces plated with suitable low resistance contact material, such as silver.

In order that the thermoelectric element 20 has the same area in contact with the pinlike element holder 22 as with the cuplike element holder 38, it may be desirable to form one or more ends of the thermoelectric element 20 tapered in generally frusto-conical shape, as illustrated at 20*c* in FIGS. 1 and 2, so that the equal areas provide a nearly constant current density in a radial direction in the thermoelectric element 20.

To provide the thermoelectric effect, the thermoelectric element 20 in the illustrated embodiment is formed of bismuth-telluride and contains selected impurities such that alternate thermoelectric elements, identified in FIG. 1 as 20*a* are of the N type and the remaining thermoelectric elements are of the P type, identified as 20*b*.

In order to provide for mounting the thermoelectric element 20 in the support plate 15, the support plate 15 is provided with a plurality of aligned counterbored apertures 24. Th apertures are arranged with adjacent counterbores opening on opposite sides of the support plate 15. Moreover, the base of the counterbores in the aperture forms a collar 25, in FIG. 2, which serves as a stop for the assembly of the thermoelectric device 16. The element holders 18 are provided with shoulders 18*c* which engage the collars 25 and serve to position the thermoelectric devices 16 within the respective apertures 24. It will be observed that due to the opposed arrangement of the counterbored apertures 24, the thermoelectric devices 16 are carried by the support plate with thermoelectric devices 16 being held in opposite directions, i.e., the cuplike element holders 18 of adjacent thermoelectric devices 16 have their terminal portions 18 extending in opposite sides of the support plate 15 while the pinlike element holders 22 have their terminal portions 22*b* extending respectively to opposite sides of the support plate 15 from the cuplike element holders 18 and, consequently, on opposite sides of the support plate 15 to each other.

To provide for serially interconnecting the thermoelectric devices 16 electrically, adjacent terminal portions of the thermoelectric devices 16 on each side of the support plate 15 are electrically connected by electrically conductive generally T-shaped members or busses 26 with the pairs of terminal portions which are so interconnected on each side of the support plate being staggered thereby to serially interconnect the thermoelectric devices 16. The crossbar of the T-shaped member 26 is joined to the respective terminal portions of the element holders while the center bar of the T-shaped member serves to support a plurality of heat transfer ribs 27 and to provide for heat transfer from the thermoelectric elements 20 to the heat transfer ribs 27. The ribs 27 are each formed of U-shaped corrugated sheet material having desirable heat conducting properties. One end of the ribs 27 is preferably in heat conducting relation with the terminal portion of the thermoelectric devices 16 which are associated with a particular conductive member, while the free ends of the ribs 27 remote from the thermoelectric devices 16 may structurally be supported from an enclosure 28 of electrically insulating material. Adjacent pairs of ribs 27, of course, are electrically isolated from each other in order to prevent shorting out of the conductive members 26 with each other.

It will be observed that the support plate 15 forms with each of the enclosures 28 the respective hot and cold areas 11 and 12 containing the heat transfer ribs 27 in heat conducting relation to the ambient. Air or other heat transfer medium may be supplied through the heat areas 11 and 12 by convection or other suitable means.

It will be appreciated that a heat pump of the type described above is provided with a thermoelectric device having improved structural properties wherein the thermoelectric element is placed and maintained in radial compression by axially wedging the thermoelectric element and the element holders toward each other. The radial compression to which the thermoelectric element is subjected not only protects it structurally against transverse and bending loads which may arise, but additionally provides for very efficient thermoelectric characteristics.

Although a thermoelectric device wherein the element holders and thermoelectric element are provided with a taper to facilitate assembling and wedging of the parts to provide the radial compression in the thermoelectric element is advantageous to a marked degree in view of its ease of assembly and the relative ease with which the radial compression is obtained, it will be appreciated that these parts may have a zero taper and come within the spirit of the present invention. Such a thermoelectric device is illustrated in FIG. 3. Referring now to FIG. 3, there is illustrated an embodiment of the invention wherein the thermoelectric element and element holders are cylindrical in form without any taper. As therein disclosed, there is provided support plates 35 of electrical insulating material carrying a plurality of similar thermoelectric devices 36, only one of which is illustrated in FIG. 3. Each of the thermoelectric devices 36 includes a first cuplike element holder 38, provided with an internal cylindrical bore 39 extending partially therethrough. A sleeve-shaped thermoelectric element 40 is tightly positioned within the internal bore 39 of the element holder 38. A second pinlike element holder 42 is provided with an external cylindrical extension **42*a* tightly positioned within the thermoelectric unit 40. The thermoelectric element 40 is provided with a tapered, frusto-conical shape end, as indicated at 40*a***, to provide for a nearly equal inner and outer area to the surface thereof for the reasons explained above.

The element holders 38 and 42 are dimensioned and assembled with the thermoelectric element in spaced relation from each other so as to provide generally radial compression in the thermoelectric element 40. The desired compression in the thermoelectric element 40 may readily be obtained, for example, by dimensioning the inside diameter of the thermoelectric element 40 to a slip fit over the extension **42*a* of the element holder 42, and thereafter the cuplike element holder 38 may be shrunk over the outside diameter of the thermoelectric element 40, closing the thermoelectric element 40 around the extension 42*a***. The desired degree of compression may readily be obtained to provide against thermal creep of the parts during the life of the device.

The thermoelectric junction in FIG. 3 is adapted for use in a heat pump of the type illustrated in the embodiment of FIGS. 1 and 2, and, more particularly, thermoelectric elements 36 may be substituted for the thermoelectric elements 16 in the heat pump of FIG. 1.

Figures 4, 5, 6:
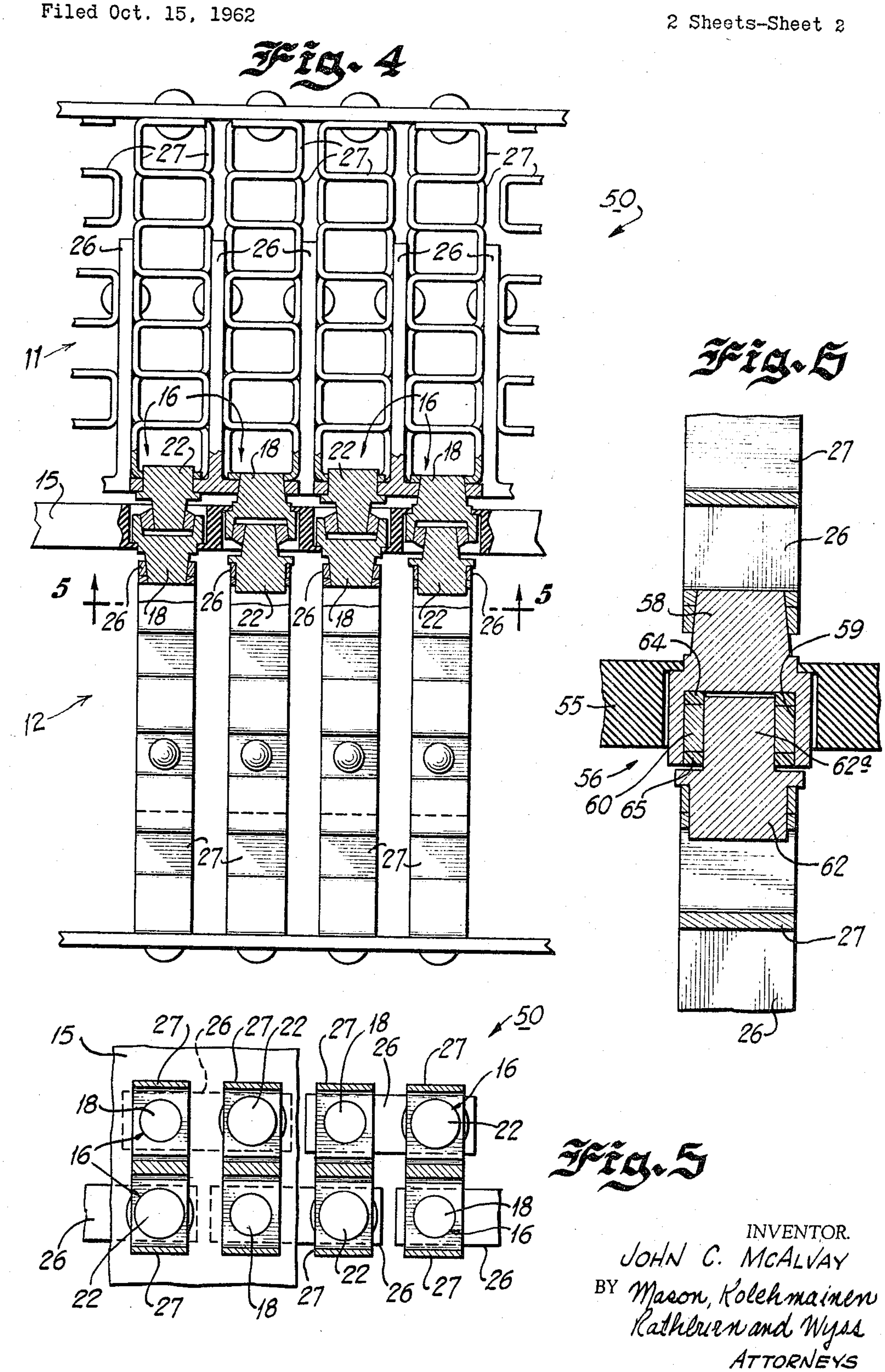
FIG. 4 is a cross-sectional view of a heat pump according to yet another embodiment of the present invention.
FIG. 5 is a cross-sectional view of the heat pump of FIG. 4 taken along line 5—5 of FIG. 4.
FIG. 6 is a cross-sectional view of a thermoelectric device according to yet another embodiment of the present invention.

Referring now to the embodiment of FIGS. 4 and 5, there is fragmentarily illustrated a section of a heat pump according to another embodiment of the present invention and generally identified as 50 in FIG. 4. The heat pump is similar in operation to that illustrated in FIG. 1, except for the electrical connection between the respective thermoelectric elements which are arranged in somewhat zig-zag manner to provide for pivoting thereof due to thermal expansion and contraction of the busses. Identical parts of the embodiments of FIG. 1 and FIGS. 4 and 5 are identified by the same reference numerals. Specifically, the heat pump includes a support plate 15 of electrically insulating material which separates hot and cold areas 11 and 12 respectively to provide for the transfer of heat between the hot and cold areas. The support plate 15 carries a plurality of the thermoelectric devices 16 identical to those heretofore described in connection with the embodiment of FIGS. 1 and 2.

As heretofore described, to provide for serially interconnecting the thermoelectric devices 16 electrically, adjacent terminal portions of the thermoelectric devices 16 on each side of the support plate 15 are electrically connected by electrically conductive generally T-shaped members or busses 26 with the pairs of terminal members which are so interconnected on each side of the support plate being staggered in zig-zag manner. In operation, the pivot-like configuration of the thermoelectric devices 16 allows the connecting busses 26 to be arranged perpendicular to each other in such a way that the busses act as links pivoted at their ends to permit adjustment for thermal expansion of the busses with minimum stress transmitted to the thermoelectric elements 16. With change in temperature, the busses 16 vary in length but with the arrangement of the busses in zig-zag fashion the change has the effect of pivoting each of the junctions a minute amount. Thus, if a certain temperature rise changed the length of the busses .010 inch, the effect would be to pivot the junction through an angle whose tangent was .020 divided by the length of buss. However, in the event that the busses were arranged longitudinally, as in the embodiment of FIGS. 1 and 2, the effect of thermal expansion and contraction would be accumulative to vary the overall length of the heat pump. Such overall variation in length may not be objectionable in certain installations, but if restrained could place unreasonably high stresses on the fragile thermoelectric elements of the thermoelectric devices 16. Moreover, such a cumulative change in length of the busses may be impracticable to accommodate in the supporting plate 15 and would result in absorption of the resulting stress by deflection of the thermoelectric material.

To further remove the mechanical stress load from the fragile thermoelectric element, tubular insulating members may be mounted in the thermoelectric device between the tubular extension of the pinlike member and the bore of the cuplike element holder. Such an arrangement is illustrated in the embodiment of FIG. 6 wherein there is illustrated an embodiment of the invention which incorporates such stress relieving rings. As therein disclosed, there is provided support plates 55 of electrically insulating material carrying a plurality of similar thermoelectric devices 56, only one of which is illustrated in FIG. 6. Each of the thermoelectric devices 56 includes a first cuplike element holder 58, provided with an internal cylindrical bore 59 extending partially therethrough.

A sleeve-shaped thermoelectric element 60 is tightly positioned within the internal bore 59 of the element holder 58. A second pinlike element holder 62 is provided with an external cylindrical extension 62a tightly positioned within the thermoelectric unit 40. In accordance with the present embodiment, a first stress relieving tubular insulating ring 64 is mounted at one side of the thermoelectric element 60 between the pinlike extension 62a and tightly within the internal bore 59. A second stress relieving tubular insulating ring is mounted at the other end of the thermoelectric element 60 also positioned on the extension 62a of the pinlike element 62 and tightly positioned within the outer edge of the internal bore 59 of the cuplike element 58. As illustrated, the rings 64 and 65 are juxtapositioned adjacent the thermoelectric element 60, but it is understood that they may be spaced therefrom. The stress-relieving rings 64 and 65 are dimensioned and assembled with a thermoelectric element in radial compression between the cuplike element holder 58 and the pinlike holder 62. The desired compression in the thermoelectric element 60 may readily be obtained by proper dimensioning of the parts, and thereafter the stress-relieving rings 64 and 65 will carry mechanical load developed in the thermoelectric device 56 to minimize the mechanical stresses transmitted to the fragile thermoelectric element 60.

Thermoelectric devices according to the present invention may employ the radial compression as a supplement to a sweat-soldered joint rather than depend on the mechanical joint alone in order to provide desirable electrical contact between the elements.

Although the present invention has been described by reference to various embodiments thereof, it will be apparent that numerous other modifications and embodiments may be devised by those skilled in the art and it is intended by the appended claims to cover all such modifications and embodiments which fall within the true spirit and scope of the present invention.

What is claimed as new and desired to be secured by Letters Patent of the United States is:

1. A thermoelectric apparatus of the type utilizing the Peltier effect and comprising a support plate of electrical insulating material provided with at least first, second, and third counterbored apertures, adjacent counterbores opening on opposite sides of said plates; first, second and third thermoelectric devices secured in respective ones of said apertures and each including a first cuplike element holder positioned in its associated counterbore with a terminal portion extending through said aperture on the side of said plate remote from the counterbore thereof, said first element holder being provided with an internal bore, a sleeve-shaped thermoelectric element tightly positioned within said bore, adjacent ones of said thermoelectric elements alternately being of the N- and P-types, and a second pinlike element holder provided with an external extension tightly positioned within said element and including a terminal portion extending on the opposite side of said plate from the terminal portion of said first element holder, said holders being dimensioned and assembled to provide radial compression in said element; first electrical conducting means electrically connecting the second holder of said first device with the first holder of said second device and second electrical conductive means electrically connecting the first holder of said second device with the second holder of said third device so that said devices are serially connected; a first plurality of heat transfer ribs connected to the holders extending on one side of said support plate to form one ambient temperature area between electrically connected ones of said devices; and a second plurality of heat transfer ribs connected to the holders extending on the other side of said support plate to form a second ambient temperature area between electrically connected ones of said devices.

2. A thermoelectric apparatus as set forth in claim 1 above wherein said internal bore, thermoelectric element, and external extension are tapered to povide generally frustro-conical surfaces, and wherein said thermoelectric element is under generally radial compression from the axial wedging thereof between said element holders.

3. A thermoelectric apparatus as set forth in claim 1 above wherein said internal bore, thermoelectric element, and external extension are generally cylindrical without any taper, and wherein said thermoelectric element is under generally radial compression from the shrink fitting of at least one of said element holders relative to said thermoelectric element and the other of said element holders.

4. A thermoelectric apparatus as set forth in claim 1 above wherein said first and second electrical conducting means include electrical busses arranged in zig-zag fashion to provide for the pivoting of the thermoelectric devices upon thermal expansion and contraction of the busses.

5. A thermoelectric apparatus comprising support means of electrical insulating material; a plurality of thermoelectric devices carried by said support means and each including a first element holder carried by said support means and provided with a terminal portion and an internal bore, the terminal portions of adjacent devices extending in opposite directions, a sleeve-shaped thermoelectric element tightly positioned within said bore, and a second element holder provided with an external extension tightly positioned within said element and including a terminal portion extending in the opposite direction from its above-mentioned terminal portion, said holders placing said element in radial compression; and defining a thermoelectric circuit radially therethrough; electrical conductive means electrically connecting adjacent devices serially; first heat transfer means connected to the holder terminal portions extending in a first direction to form one ambient temperature area; and second heat transfer means connected to the holder terminal portions extending in a second direction to form a second ambient temperature area.

6. A thermoelectric apparatus as set forth in claim 5 above wherein said first element holders are generally cup-shaped and said second element holders are generally pin-shaped.

7. A thermoelectric apparatus as set forth in claim 6 above wherein said internal bore, thermoelectric element, and external extension are tapered to provide generally frustro-conical surfaces, and wherein said thermoelectric element is under generally radial compression from the axial wedging thereof between said element holders.

8. A thermoelectric apparatus as set forth in claim 6 above wherein said internal bore, thermoelectric element, and external extension are generally cylindrical without any taper, and wherein said thermoelectric element is under generally radial compression from the shrink fitting of at least one of said element holders relative to said thermoelectric element and the other of said element holders.

9. A thermoelectric device for a thermoelectric apparatus utilizing the Peltier effect and comprising a first element holder provided with an internal bore and forming an electrical conductor, a sleeve-shaped thermoelectric element tightly positioned within said bore, and a second element holder provided with an external extension tightly positioned within said element and forming an electrical conductor, said holders being dimensioned and assembled to provide radial compression in said element and define a thermoelectric circuit radially therethrough.

10. A thermoelectric device as set forth in claim 9 above wherein said internal bore, thermoelectric element, and externnal extension are tapered to provide generally frusto-conical surfaces, and wherein said thermoelectric element is under generally radial compression from the axial wedging thereof between said element holders.

11. A thermoelectric device as set forth in claim 9 above wherein said internal bore, thermoelectric element, and external extension are generally cylindrical without any taper, and wherein said thermoelectric element is under generally radial compression from the shrink fitting of at least one of said element holders relative to said thermoelectric element and the other of said element holders.

12. A thermoelectric device as set forth in claim 9 above wherein one end surface of said thermoelectric element is tapered in generally frustro-conical fashion so that the inner area and outer area of the thermoelectric element is substantially the same.

13. A thermoelectric device as set forth in claim 9 above and additionally including insulating ring means positioned between said holders.

14. A thermoelectric device comprising a first element holder provided with an internal bore, a sleeve-shaped thermoelectric element tightly positioned within said bore, and a second element holder provided with an external extension tightly positioned within said element, said holders subjecting said element to radial compression and defining a thermoelectric circuit radially therethrough.

References Cited by the Examiner

UNITED STATES PATENTS

| | | | |
|---|---|---|---|
| 773,838 | 11/1904 | Wightman. | |
| 2,543,331 | 2/1951 | Okolicsanyi | 136—4 |
| 2,844,638 | 7/1958 | Lindenblad | 136—4 |
| 2,993,080 | 7/1961 | Poganski | 136—4 |

FOREIGN PATENTS

| | | |
|---|---|---|
| 1,269,391 | 7/1961 | France. |
| 874,660 | 8/1961 | Great Britain. |

WINSTON A. DOUGLAS, *Primary Examiner.*

ALLEN B. CURTIS, *Examiner.*